US012809254B2

(12) United States Patent
Kim et al.

(10) Patent No.: US 12,809,254 B2
(45) Date of Patent: Nov. 24, 2026

(54) PHOTOSENSITIVE RESIN COMPOSITION, PHOTOSENSITIVE RESIN LAYER USING THE SAME, AND COLOR FILTER

(71) Applicant: SAMSUNG SDI CO., LTD., Yongin-si (KR)

(72) Inventors: Ieju Kim, Suwon-si (KR); Baek Soung Park, Suwon-si (KR); Kwangseop Kim, Suwon-si (KR); Sabina Kim, Suwon-si (KR); Ickjin Kim, Suwon-si (KR); Sangho Lee, Suwon-si (KR); MyungHo Cho, Suwon-si (KR); Jeongho Yoo, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 606 days.

(21) Appl. No.: 18/239,301

(22) Filed: Aug. 29, 2023

(65) Prior Publication Data

US 2024/0094631 A1 Mar. 21, 2024

(30) Foreign Application Priority Data

Aug. 30, 2022 (KR) ........................ 10-2022-0109343

(51) Int. Cl.

| | |
|---|---|
| ***G03F 7/00*** | (2006.01) |
| ***G02B 5/22*** | (2006.01) |
| ***G03F 7/004*** | (2006.01) |
| ***G03F 7/031*** | (2006.01) |

(52) U.S. Cl.

CPC .......... *G03F 7/0007* (2013.01); *G03F 7/0045* (2013.01); *G03F 7/031* (2013.01); *G02B 5/223* (2013.01)

(58) Field of Classification Search

CPC ...... G03F 7/0007; G03F 7/0045; G03F 7/031; G03F 7/004; G03F 7/027; G03F 7/105; G02B 5/223; G02B 5/20; C08F 2/44; C08F 2/50

USPC ..................... 430/270.1, 271.1, 272.1, 273.1

See application file for complete search history.

(56) References Cited

U.S. PATENT DOCUMENTS

| | | | | |
|---|---|---|---|---|
| 5,378,274 | A | 1/1995 | Yokoyama et al. | |
| 2008/0180611 | A1 | 7/2008 | Minato et al. | |
| 2013/0001483 | A1 * | 1/2013 | Lee | G03F 7/0007 252/586 |
| 2014/0178815 | A1 * | 6/2014 | Jung | G03F 7/028 430/281.1 |
| 2015/0192699 | A1 * | 7/2015 | Choi | G02B 1/04 252/586 |
| 2021/0325068 | A1 | 10/2021 | Wakisaka | |
| 2023/0185190 | A1 * | 6/2023 | Park | G03F 7/0048 |

FOREIGN PATENT DOCUMENTS

| | | | |
|---|---|---|---|
| CN | 101236267 | B | 10/2012 |
| JP | 3073769 | B2 | 8/2000 |
| JP | 2002-267832 | A | 9/2002 |
| JP | 4469600 | B2 | 5/2010 |
| JP | 4652213 | B2 | 3/2011 |
| JP | 2014-178477 | A | 9/2014 |
| JP | 2014-208815 | A | 11/2014 |
| JP | 2015-137320 | A | 7/2015 |
| JP | 2020-012115 | A | 1/2020 |
| JP | 2020-038334 | A | 3/2020 |
| JP | 2020-038335 | A | 3/2020 |
| JP | 2020-109343 | A | 7/2020 |
| JP | 2023-077397 | A | 6/2023 |
| JP | 2023-090171 | A | 6/2023 |
| KR | 10-1931249 | B1 | 12/2018 |
| KR | 10-2222742 | B1 | 3/2021 |
| KR | 10-2021-0063526 | A | 6/2021 |
| TW | 202147031 | A | 12/2021 |
| WO | WO 2021-014759 | A1 | 1/2021 |

OTHER PUBLICATIONS

Korean Notice of Allowance dated Apr. 24, 2025.
Japanese Office action dated Apr. 2, 2024.
Taiwanese Office action dated May 14, 2024.

* cited by examiner

*Primary Examiner* — Caleen O Sullivan
(74) *Attorney, Agent, or Firm* — Lee IP Law, P.C.

(57) ABSTRACT

A photosensitive resin composition, a photosensitive resin layer manufactured using the same, and a color filter, the photosensitive resin composition includes a colorant; a photopolymerizable compound; a photopolymerization initiator; a binder resin; and a solvent, wherein the colorant includes a first pigment and a second pigment, and a D50 particle diameter ratio of the first pigment and the second pigment is about 1.01:1 to about 1.5:1.

16 Claims, No Drawings

PHOTOSENSITIVE RESIN COMPOSITION, PHOTOSENSITIVE RESIN LAYER USING THE SAME, AND COLOR FILTER

CROSS-REFERENCE TO RELATED APPLICATION

This application claims priority to and the benefit of Korean Patent Application No. 10-2022-0109343 filed in the Korean Intellectual Property Office on Aug. 30, 2022, the entire contents of which are incorporated herein by reference.

BACKGROUND

1. Field

Embodiments relate to a photosensitive resin composition, a photosensitive resin layer manufactured using the same, and a color filter.

2. Description of the Related Art

Recently, a demand for solid image sensors such as image sensors and the like has greatly increased due to the spread of digital cameras, cell phones with cameras, and the like. These displays or optical devices may use a color filter as a key device, which increasingly utilizes higher sensitivity and down-sizing.

SUMMARY

The embodiments may be realized by providing a photosensitive resin composition including a colorant; a photopolymerizable compound; a photopolymerization initiator; a binder resin; and a solvent, wherein the colorant includes a first pigment and a second pigment, and a D50 particle diameter ratio of the first pigment and the second pigment is about 1.01:1 to about 1.5:1.

The D50 particle diameter ratio of the first pigment and the second pigment may be about 1.1:1 to about 1.3:1.

The first pigment may be a blue pigment and the second pigment is a violet pigment.

The first pigment may include a copper phthalocyanine blue pigment represented by Chemical Formula 1:

[Chemical Formula 1]

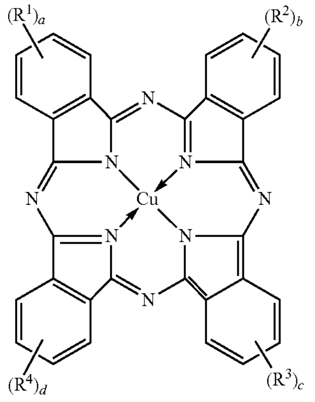

in Chemical Formula 1, $R^1$ to $R^4$ may each independently be a hydrogen atom, a halogen atom, a cyano group, a hydroxy group, an epoxy group, a (meth)acrylate group, or a substituted or unsubstituted C1 to C20 alkyl group; and a to d may each independently be an integer of 1 to 4.

The first pigment may include a copper phthalocyanine blue pigment represented by Chemical Formula 1-1:

[Chemical Formula 1-1]

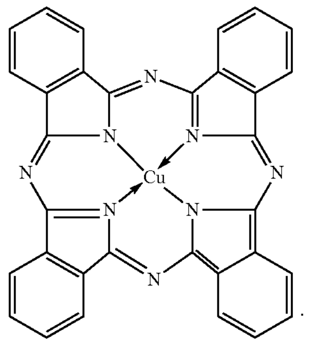

The second pigment may include a carbazole dioxazine violet pigment represented by Chemical Formula 2, a perylene violet pigment represented by Chemical Formula 3, or a mixture thereof,

[Chemical Formula 2]

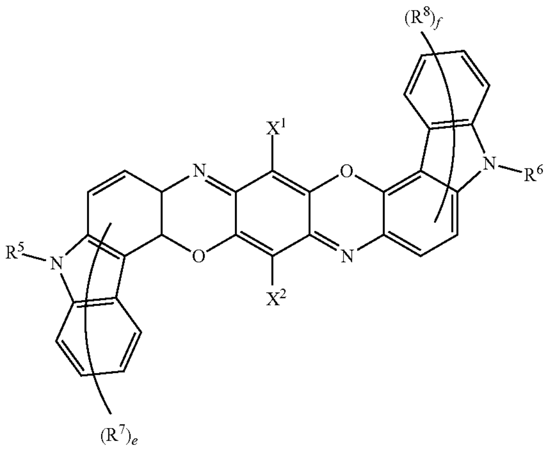

in Chemical Formula 2, $R^5$ and $R^6$ may each independently be a hydrogen atom or a substituted or unsubstituted C1 to C20 alkyl group; $R^7$ and $R^8$ may each independently be a hydrogen atom, a halogen atom, a cyano group, a hydroxy group, an epoxy group, a (meth)acrylate group, or a substituted or unsubstituted C1 to C20 alkyl group; $X^1$ and $X^2$ may each independently be a halogen atom; and e and f may each independently be an integer of 1 to 6;

[Chemical Formula 3]

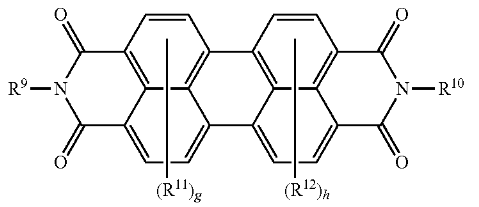

in Chemical Formula 3, $R^9$ and $R^{10}$ may each independently be a hydrogen atom or a substituted or unsubstituted C1 to C20 alkyl group; $R^{11}$ and $R^{12}$ may each independently be a hydrogen atom, a halogen atom, a cyano group, a hydroxy group, an epoxy group, a (meth)acrylate group, or a substituted or unsubstituted C1 to C20 alkyl group; and g and h may each independently be an integer of 1 to 4.

The second pigment may include a carbazole dioxazine violet pigment represented by Chemical Formula 2-1, a perylene violet pigment represented by Chemical Formula 3-1, or a mixture thereof,

[Chemical Formula 2-1]

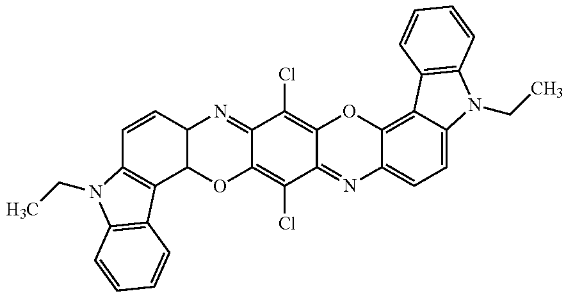

[Chemical Formula 3-1]

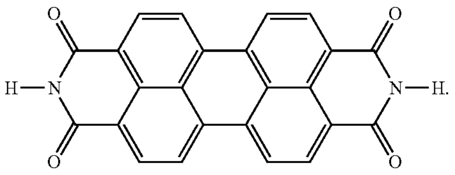

A weight ratio of the first pigment and the second pigment may be about 10:90 to about 90:10.

All pigments of the photosensitive resin composition may be included in an amount of about 30 wt % to about 40 wt %, based on a total weight of the photosensitive resin composition.

The binder resin may include an acrylic binder resin, an epoxy binder resin, or a combination thereof.

The photosensitive resin composition may include about 30 wt % to about 70 wt % of the colorant; about 1 wt % to about 20 wt % of the photopolymerizable compound; about 0.1 wt % to about 5 wt % of the photopolymerization initiator; about 1 wt % to about 20 wt % of the binder resin; and the solvent, all wt % being based on a total weight of the photosensitive resin composition.

The photosensitive resin composition may further include malonic acid; 3-amino-1,2-propanediol; a coupling agent including a vinyl group or a (meth)acryloxy group; a leveling agent; a fluorine surfactant; or a radical polymerization initiator.

The embodiments may be realized by providing a photosensitive resin layer manufactured using the photosensitive resin composition according to the embodiments.

The embodiments may be realized by providing a color filter including the photosensitive resin layer according to the embodiments.

The embodiments may be realized by providing a CMOS image sensor including the color filter according to the embodiments.

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer or element is referred to as being “on” another layer or element, it can be directly on the other layer or element, or intervening layers may also be present. In addition, it will also be understood that when a layer is referred to as being “between” two layers, it can be the only layer between the two layers, or one or more intervening layers may also be present. As used herein, the term “or” is not necessarily an exclusive term, e.g., “A or B” would include A, B, or A and B.

As used herein, when specific definition is not otherwise provided, “substituted” refers to replacement of at least one hydrogen of a compound by a halogen atom (F, Cl, Br, or I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, or a combination thereof.

As used herein, when specific definition is not otherwise provided, “heterocycloalkyl group”, “heterocycloalkenyl group”, “heterocycloalkynyl group,” and “heterocycloalkylene group” refer to presence of at least one N, O, S, or P in a cyclic compound of cycloalkyl, cycloalkenyl, cycloalkynyl, or cycloalkylene.

As used herein, when specific definition is not otherwise provided, “(meth)acrylate” refers to both “acrylate” and “methacrylate”.

In the chemical formula of the present specification, unless a specific definition is otherwise provided, hydrogen is boned at the position when a chemical bond is not drawn where supposed to be given.

As used herein, when a definition is not otherwise provided, “*” means a portion linked to the same or different atoms or chemical formulas.

As used herein, “particle size” or “particle diameter” is defined as particle size in a particle size distribution standard. Specifically, the particle size or particle diameter “Dn” means the particle size when particles are accumulated up to “n %” in a volume ratio of particles distributed in various particle sizes. For example, D50 means a particle size when particles are accumulated up to 50% in a volume ratio.

The particle size or particle diameter "Dn" can be measured by methods well known to those skilled in the art, for example, by particle size analyzer, or by transmission electron micrograph or scanning electron micrograph. Alternatively, it may be measured using a dynamic light scattering method and then subjected to data analysis.

Photosensitive Resin Composition

Embodiments provides a photosensitive resin composition including, e.g., (A) a colorant; (B) a photopolymerizable compound; (C) a photopolymerization initiator; (D) a binder resin; and (E) a solvent. In an implementation, the colorant may include a first pigment and a second pigment and a D50 particle diameter ratio of the first pigment and the second pigment is about 1.01:1 to about 1.5:1.

When manufacturing a color filter using a pigment dispersion method, there may be an advantage of being stable against light or heat, but an optical disturbance could occur.

If one type of pigment were to be used alone, pigment particles could be aggregated and coarsened in the photosensitive resin composition, and optical disturbances such as light scattering and color non-uniformity could occur in the finally manufactured color filter, giving a visually rough feeling.

In an implementation, in order to address the above issue, in the photosensitive resin composition in which at least two types of pigments are co-dispersed, the particle size ratio of the co-dispersed pigments may be adjusted.

Hereinafter, the photosensitive resin composition of the embodiments will be described in more detail.

(A) Colorant

First, the colorant is described.

As described above, the colorant may include at least two types of pigments.

In an implementation, the colorant includes a first pigment and a second pigment. In an implementation, when at least two types of pigments are used, aggregation of different pigment particles in the photosensitive resin composition may be prevented, and coarsening may be suppressed. Accordingly, it is possible to increase processability of the composition by increasing a content of a transparent material such as a binder resin and a photopolymerizable compound while obtaining an effect of resolving optical disturbances such as light scattering and color non-uniformity of the color filter.

In an implementation, a ratio of the particle sizes of the first pigment and the second pigment may satisfy a specific range.

In an implementation, the first pigment and the second pigment have a D50 particle diameter ratio (first pigment: second pigment) of, e.g., about 1.01:1 to about 1.5:1. If the D50 particle diameter ratio (first pigment:second pigment) were to be less than about 1.01:1, and the D50 particle diameter of the first pigment slightly larger than the D50 particle diameter of the second pigment, the first pigment particles could not be dispersed. If the D50 particle diameter of the first pigment is excessively larger than the D50 particle diameter of the second pigment, the dispersibility could be deteriorated. In an implementation, the ratio of the D50 particle diameter (first pigment:second pigment) may be less than or equal to about 1.5:1.

Considering this relationship, the ratio of the D50 particle size (first pigment: second pigment) may be adjusted within the range of, e.g., about 1.01:1 to about 1.5:1, about 1.05:1 to about 1.4:1, or about 1.1:1 to about 1.3:1.

Overall, the photosensitive resin composition of the embodiments, in the photosensitive resin composition in which at least two types of pigments are co-dispersed, the particle size ratio of the co-dispersed pigments may be controlled, thereby suppressing light scattering and color non-uniformity of the color filter and eliminating optical disturbance.

Hereinafter, the colorant will be described in more detail.

Particle Size Distribution of Pigments

All pigments including the first pigment and the second pigment may have a small content of fine powder and coarse powder in terms of particle size distribution.

Herein, a particle diameter ratio of D90/D10 may indicate a width of the particle size distribution. The larger the particle diameter ratio of D90/D10, the wider the particle size distribution, and the higher the content of fine and coarse powders. The smaller the value of D90/D10, the narrower the particle size distribution, which means the smaller the content of fine and coarse powders.

In an implementation, in all the pigments including the first pigment and the second pigment, the D90/D10 particle diameter ratio may be about 1.5 to about 2.0.

In an implementation, all of the pigments (including the first pigment and the second pigment) may have a D50 particle diameter of about 20 nm to about 40 nm.

Color of Pigment and Colorant Including Same

The colorant may be any suitable color, e.g., red, blue, or green. In an implementation, the colorant may, e.g., express blue. In an implementation, a blue pigment may be used as the first pigment, and a violet pigment may be used as the second pigment.

In an implementation, the first pigment may include, e.g., a copper phthalocyanine blue pigment represented by Chemical Formula 1.

[Chemical Formula 1]

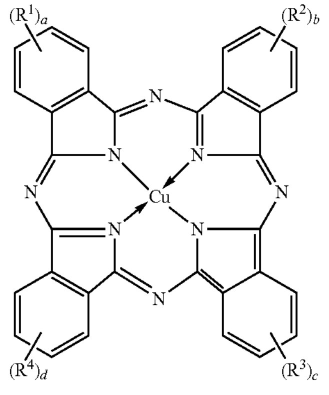

In Chemical Formula 1, $R^1$ to $R^4$ may each independently be or include, e.g., a hydrogen atom, a halogen atom, a cyano group, a hydroxy group, an epoxy group, a (meth) acrylate group, or a substituted or unsubstituted C1 to C20 alkyl group. a to d may each independently be, e.g., an integer of 1 to 4.

In an implementation, the first pigment may include, e.g., a copper phthalocyanine blue pigment represented by Chemical Formula 1-1.

[Chemical Formula 1-1]

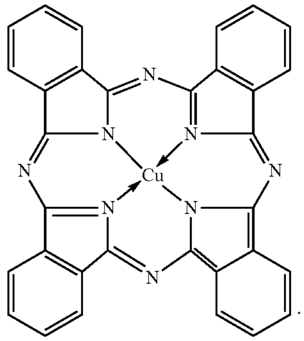

The copper phthalocyanine blue pigment represented by Chemical Formula 1-1 may be implemented with, e.g., C.I. Blue Pigment 15, C.I. Blue Pigment 15:1, C.I. Blue Pigment 15:2, C.I. Blue Pigment 15:3, C.I. Blue Pigment 15:4, C.I. Blue Pigment 15:5, C.I. Blue Pigment 15:6, C.I. Blue Pigment 16, or the like, according to its crystallinity, in the color index and these may be used alone or in a mixture of two or more.

The second pigment may include, e.g., a carbazole dioxazine violet pigment represented by Chemical Formula 2, a perylene violet pigment represented by Chemical Formula 3, or a mixture thereof.

[Chemical Formula 2]

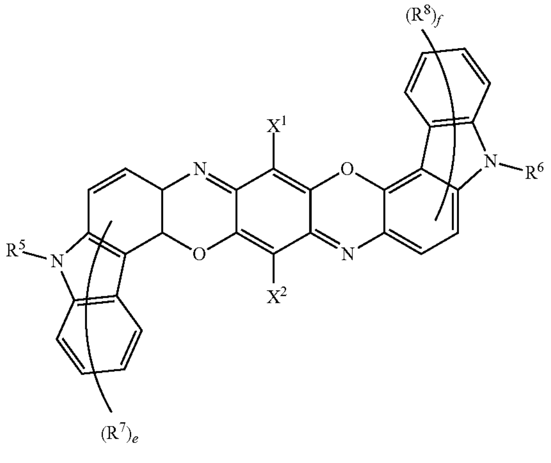

In Chemical Formula 2, $R^5$ and $R^6$ may each independently be or include, e.g., a hydrogen atom or a substituted or unsubstituted C1 to C20 alkyl group. $R^7$ and $R^8$ may each independently be or include, e.g., a hydrogen atom, a halogen atom, a cyano group, a hydroxy group, an epoxy group, a (meth)acrylate group, or a substituted or unsubstituted C1 to C20 alkyl group. $X^1$ and $X^2$ may each independently be, e.g., a halogen atom. e and f may each independently be, e.g., an integer of 1 to 6.

[Chemical Formula 3]

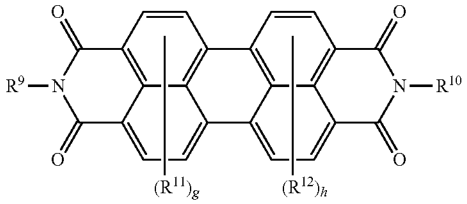

In Chemical Formula 3, $R^9$ and $R^{10}$ may each independently be or include, e.g., a hydrogen atom or a substituted or unsubstituted C1 to C20 alkyl group. $R^{11}$ and $R^{12}$ may each independently be or include, e.g., a hydrogen atom, a halogen atom, a cyano group, a hydroxy group, an epoxy group, a (meth)acrylate group, or a substituted or unsubstituted C1 to C20 alkyl group. g and h may each independently be, e.g., an integer of 1 to 4.

In an implementation, the second pigment may include, e.g., a carbazole dioxazine violet pigment represented by Chemical Formula 2-1, a perylene violet pigment represented by Chemical Formula 3-1, or a mixture thereof.

[Chemical Formula 2-1]

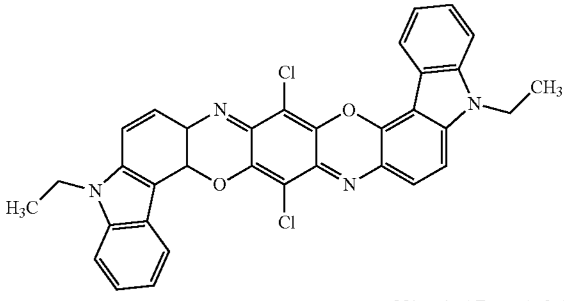

[Chemical Formula 3-1]

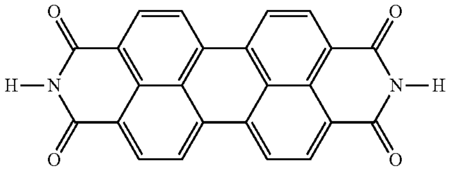

The carbazole dioxazine violet pigment represented by Chemical Formula 2-1 may be, e.g., C.I. Violet Pigment 23 (V 23) in the color index. In an implementation, the perylene violet pigment represented by Chemical Formula 3-1 may be, e.g., C.I. Violet Pigment 29 (V 29).

In an implementation, a dioxazine violet, first violet B, methyl violet lake, indanthrene brilliant violet, or the like may be used, and these may be used alone or in a mixture of two or more.

When the colorant is not blue, a red pigment, a green pigment, a yellow pigment, a black pigment, or the like can be used in addition to the blue pigment and the violet pigment.

In an implementation, the red pigment may include, e.g., C.I. Red Pigment 254, C.I. Red Pigment 255, C.I. Red Pigment 264, C.I. Red Pigment 270, C.I. Red Pigment 272, C.I. Red Pigment 177, C.I. Red pigment 89, or the like, in the color index and these may be used alone or in a mixture of two or more.

In an implementation, the green pigment may include, e.g., C.I. Green Pigment 7, C.I. Green Pigment 36, C.I. Green Pigment 58, C.I. Green pigment 59, or the like, in the color index and these may be used alone or in a mixture of two or more.

In an implementation, the yellow pigment may include, e.g., an isoindoline pigment such as C.I. Yellow Pigment 185, C.I. Yellow Pigment 139, or the like, a quinophthalone pigment such as C.I. Yellow Pigment 138, a nickel complex pigment such as C.I. Yellow Pigment 150 in the color index, and these may be used alone or in a mixture of two or more.

In an implementation, the black pigment may include, e.g., aniline black, perylene black, titanium black, carbon black, or the like, in the color index, and these may be used alone or in a mixture of two or more.

Pigment Mixing Ratio

In an implementation, a weight ratio of the first pigment and the second pigment may not necessarily be proportional to the ratio of the D50 particle size (first pigment:second pigment).

In an implementation, the weight ratio of the first pigment and the second pigment may be, e.g., about 10:90 to about 90:10. In an implementation, when the first pigment is a blue pigment and the second pigment is a violet pigment, the weight ratio of the first pigment and the second pigment may be, e.g., about 60:40 to about 50:50 in order to realize a blue color by combining them.

Pigment Content

In an implementation, an amount of the all pigments (including the first pigment and the second pigment) may be, e.g., about 30 wt % to about 70 wt %, about 35 wt % to about 60 wt %, or about 45 wt % to about 55 wt %, based on a total weight of the photosensitive resin composition.

Pigment Dispersion

In an implementation, the first pigment and the second pigment may be included in the photosensitive resin composition in the form of a dispersion.

The pigment dispersion may include, e.g., a solvent, a dispersant, a dispersion resin, or the like, in addition to the first pigment and the second pigment.

In an implementation, the solvent may include, e.g., ethylene glycol acetate, ethyl cellosolve, propylene glycol methyl ether acetate, ethyl lactate, polyethylene glycol, cyclohexanone, propylene glycol methyl ether, or the like. In an implementation, propylene glycol methyl ether acetate may be used.

The dispersant may help to uniformly disperse the pigment in the dispersion, and each of a nonionic, anionic, or cationic dispersant may be used. In an implementation, polyalkylene glycol or esters thereof, polyoxyalkylene, a polyhydric alcohol ester alkylene oxide adduct, an alcohol alkylene oxide adduct, a sulfonic acid ester, a sulfonic acid salt, a carboxylic acid ester, a carboxylic acid salt, an alkyl amide alkylene oxide adduct, alkyl amine, or the like may be used, and these may be used alone or in a mixture of two or more.

The dispersion resin may include an acrylic resin containing a carboxy group, which may help improve stability of the pigment dispersion and also improve pixel patternability.

All of the pigments (including the first pigment and the second pigment) may be included in an amount of about 10 wt % to about 20 wt % in the pigment dispersion (e.g., based on a total weight of the pigment dispersion).

Photopolymerizable Compound

The photopolymerizable compound may include, e.g., a mono-functional or multi-functional ester of (meth)acrylic acid including at least one ethylenic unsaturated double bond.

The photopolymerizable compound may have an ethylenic unsaturated double bond and thus, may facilitate or undergo sufficient polymerization during exposure in a pattern-forming process and form a pattern having excellent heat resistance, light resistance, and chemical resistance.

Examples of the photopolymerizable compound may include ethylene glycol di(meth)acrylate, diethylene glycol di(meth)acrylate, triethylene glycol di(meth)acrylate, propylene glycol di(meth)acrylate, neopentyl glycol di(meth) acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth)acrylate, pentaerythritol hexa(meth) acrylate, dipentaerythritol di(meth)acrylate, dipentaerythritol tri(meth)acrylate, dipentaerythritol penta (meth)acrylate, dipentaerythritol hexa(meth)acrylate, bisphenol A epoxy(meth)acrylate, ethylene glycol monomethylether (meth)acrylate, trimethylol propane tri(meth)acrylate, tris(meth)acryloyloxyethyl phosphate, novolac epoxy (meth)acrylate, and the like.

Commercially available examples of the photopolymerizable compound may be as follows. The mono-functional (meth)acrylic acid ester may include Aronix M101®, Aronix M-111®, Aronix M-114® (Toagosei Chemistry Industry Co., Ltd.); KAYARAD TC-110S®, KAYARAD TC-120S® (Nippon Kayaku Co., Ltd.); V-158®, V-2311® (Osaka Organic Chemical Ind., Ltd.), or the like. Examples of a difunctional (meth)acrylic acid ester may include Aronix M-210®, Aronix M-240®, Aronix M-6200® (Toagosei Chemistry Industry Co., Ltd.), KAYARAD HDDA®, KAYARAD HX-220®, KAYARAD R-604® (Nippon Kayaku Co., Ltd.), V-260®, V-312®, V-335 HP® (Osaka Organic Chemical Ind., Ltd.), and the like. Examples of a tri-functional (meth)acrylic acid ester may include Aronix M-309®, Aronix M-400®, Aronix M-405®, Aronix M-450®, Aronix M-710®, Aronix M-8030®, Aronix M-8060® (Toagosei Chemistry Industry Co., Ltd.); KAYARAD TMPTA®, KAYARAD DPCA-20®, KAYARAD DPCA-30®, KAYARAD DPCA-60®, KAYARAD DPCA-120® (Nippon Kayaku Co., Ltd.); V-295®, V-300®, V-360®, V-GPT®, V-3PA®, V-400® (Osaka Yuki Kayaku Kogyo Co. Ltd.), and the like. These may be used alone or as a mixture of two or more.

In an implementation, the photopolymerizable compound may be treated with an acid anhydride or modified ethylene oxide to impart better developability.

In an implementation, the photopolymerizable compound may be included in an amount of, e.g., about 1 wt % to about 20 wt %, about 1 wt % to about 4 wt %, or about 1 wt % to about 3 wt % based on a total amount of the photosensitive resin composition. When the photopolymerizable compound is included within the above ranges, sufficient curing may occur during exposure in the pattern forming process, resulting in excellent reliability and excellent developability with an alkali developing solution.

Photopolymerization Initiator

The photopolymerization initiator may include an initiator suitably used in a photosensitive resin composition, e.g., an acetophenone compound, a benzophenone compound, a thioxanthone compound, a benzoin compound, a triazine compound, an oxime compound, or a combination thereof.

Examples of the acetophenone compound may include 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like.

Examples of the benzophenone compound may include benzophenone, benzoyl benzoate, benzoyl methyl benzoate, 4-phenyl benzophenone, hydroxy benzophenone, acrylated benzophenone, 4,4'-bis(dimethyl amino)benzophenone, 4,4'-bis(diethylamino)benzophenone, 4,4'-dimethylamino-benzophenone, 4,4'-dichlorobenzophenone, 3,3'-dimethyl-2-methoxybenzophenone, and the like.

Examples of the thioxanthone compound may include thioxanthone, 2-methylthioxanthone, isopropyl thioxanthone, 2,4-diethyl thioxanthone, 2,4-diisopropyl thioxanthone, 2-chlorothioxanthone, and the like.

Examples of the benzoin compound may include benzoin, benzoin methyl ether, benzoin ethyl ether, benzoin isopropyl ether, benzoin isobutyl ether, benzyldimethylketal, and the like.

Examples of the triazine compound may include 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl 4,6-bis(trichloro methyl)-s-triazine, bis(trichloromethyl)-6-styryl-s-triazine, 2-(naphthol-yl)-4,6-bis(trichloromethyl)-s-triazine, 2-(4-methoxynaphthol-yl)-4,6-bis(trichloromethyl)-s-triazine, 2-4-bis(trichloromethyl)-6-piperonyl-s-triazine, 2-4-bis(trichloromethyl)-6-(4-methoxystyryl)-s-triazine, and the like.

Examples of the oxime compound may include an O-acyloxime compound, 2-(o-benzoyloxime)-1-[4-(phenylthio) phenyl]-1,2-octandione, 1-(o-acetyloxime)-1-[9-ethyl-6-(2-methylbenzoyl)-9H-carbazol-3-yl]ethanone, O-ethoxycarbonyl-α-oxyamino-1-phenylpropan-1-one, and the like. Specific examples of the O-acyloxime compound may be 1,2-octandione, 2-dimethylamino-2-(4-methylbenzyl)-1-(4-morpholin-4-yl-phenyl)-butan-1-one, 1-(4-phenylsulfanyl phenyl)-butane-1,2-dione2-oxime-O-benzoate, 1-(4-phenylsulfanyl phenyl)-octane-1,2-dione2-oxime-O-benzoate, 1-(4-phenylsulfanyl phenyl)-octan-1-oneoxime-O-acetate, 1-(4-phenylsulfanyl phenyl)-butan-1-oneoxime-O-acetate, and the like.

In an implementation, the photopolymerization initiator may further include, e.g., a carbazole compound, a diketone compound, a sulfonium borate compound, a diazo compound, an imidazole compound, a biimidazole compound, a fluorene compound, or the like, in addition to the compounds.

The photopolymerization initiator may be used with a photosensitizer capable of causing a chemical reaction by absorbing light and becoming excited and then, transferring its energy.

Examples of the photosensitizer may include tetraethylene glycol bis-3-mercapto propionate, pentaerythritol tetrakis-3-mercapto propionate, dipentaerythritol tetrakis-3-mercapto propionate, and the like.

In an implementation, the photopolymerization initiator may be included in an amount of, e.g., about 0.1 wt % to about 5 wt %, about 0.3 wt % to about 4 wt %, or about 0.5 wt % to about 3 wt %, based on a total weight of the photosensitive resin composition. When the photopolymerization initiator is included within the ranges, sufficient photopolymerization may occur during exposure in a pattern-forming process, excellent reliability may be realized, heat resistance, light resistance, and chemical resistance of patterns, resolution, and close contacting properties may be improved, and a decrease of transmittance due to a non-reaction initiator may be prevented.

Binder Resin

The photosensitive resin composition may include a binder resin, and the binder resin may include, e.g., an acrylic binder resin.

The acrylic binder resin may be, e.g., a copolymer of a first ethylenic unsaturated monomer and a second ethylenic unsaturated monomer that is copolymerizable therewith, and may be a resin including at least one acryl repeating unit.

The first ethylenic unsaturated monomer may include, e.g., an ethylenic unsaturated monomer including at least one carboxyl group and examples of the monomer may include acrylic acid, methacrylic acid, maleic acid, itaconic acid, fumaric acid, and a combination thereof.

The first ethylenic unsaturated monomer may be included in an amount of, e.g., about 5 wt % to about 50 wt %, or about 10 wt % to about 40 wt %, based on a total weight of the acrylic binder resin.

The second ethylenic unsaturated monomer may include, e.g., an aromatic vinyl compound such as styrene, α-methylstyrene, vinyl toluene, vinylbenzylmethylether or the like; an unsaturated carboxylate ester compound such as methyl (meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, or the like; an unsaturated amino alkyl carboxylate ester compound such as 2-aminoethyl(meth) acrylate, 2-dimethylaminoethyl(meth)acrylate, or the like; a carboxylic acid vinyl ester compound such as vinyl acetate, vinyl benzoate, or the like; an unsaturated glycidyl carboxylate ester compound such as glycidyl(meth)acrylate or the like; a vinyl cyanide compound such as (meth)acrylonitrile or the like; an unsaturated amide compound such as (meth) acrylamide or the like; or the like, and may be used alone or as a mixture of two or more.

Examples of the acrylic binder resin may include a (meth)acrylic acid/benzylmethacrylate copolymer, a (meth) acrylic acid/benzylmethacrylate copolymer, a (meth)acrylic acid/benzylmethacrylate/styrene copolymer, a (meth)acrylic acid/benzylmethacrylate/2-hydroxyethylmethacrylate copolymer, a (meth)acrylic acid/benzylmethacrylate/styrene/2-hydroxyethylmethacrylate copolymer, and the like, and these may be used alone or as a mixture of two or more.

The binder resin may include an epoxy binder resin.

The binder resin may help improve heat resistance by further including the epoxy binder resin. In an implementation, the epoxy binder resin may include, e.g., a phenol novolac epoxy resin, a tetramethyl biphenyl epoxy resin, a bisphenol A epoxy resin, a bisphenol F epoxy resin, an alicyclic epoxy resin, or a combination thereof.

In an implementation, the binder resin including the epoxy binder resin may help secure dispersion stability of a colorant such as a pigment, which will be described below, and may help form a pixel having a desired resolution during a developing process.

The epoxy binder resin may be included in an amount of, e.g., about 1 wt % to about 10 wt %, or about 5 wt % to about 10 wt %, based on a total weight of the binder resin. When the epoxy binder resin is included in the above ranges, film residue ratio and chemical resistance may be greatly improved.

An epoxy equivalent weight of the epoxy resin may be, e.g., about 150 g/eq to about 200 g/eq. When an epoxy binder resin having an epoxy equivalent within the above range is included in the binder resin, there may be an advantageous effect in improving a curing degree of the formed pattern and fixing the colorant in the structure in which the pattern is formed.

The binder resin may be dissolved in a solvent to be described below in a solid form to form a photosensitive resin composition. In this case, the binder resin in the solid form may be, e.g., about 10 wt % to about 50 wt %, or about 20 wt % to about 40 wt %, based on a total weight of the binder resin solution dissolved in the solvent.

The binder resin may be included in an amount of, e.g., about 1 wt % to about 20 wt %, about 2 wt % to about 15 wt %, or about 3 wt % to about 10 wt %, based on a total weight of the photosensitive resin composition. When the binder resin is included within the above ranges, it is possible to obtain excellent surface smoothness due to excellent developability and improved crosslinking property during manufacture of the color filter.

Solvent

The solvent may be a material that has compatibility with the colorant, the photopolymerizable compound, the photopolymerization initiator, and the binder resin but do not react.

Examples of the solvent may include alcohols such as methanol, ethanol, and the like; ethers such as dichloroethyl ether, n-butyl ether, diisoamyl ether, methylphenyl ether, tetrahydrofuran, and the like; alkyl acetates such as ethyl acetate, butyl acetate, and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactate esters such as methyl lactate, ethyl lactate, and the like; oxy acetic acid alkyl esters such as oxy methyl acetate, oxy ethyl acetate, butyl oxyacetate, and the like; alkoxy acetic acid alkyl esters such as methoxy methyl acetate, methoxy ethyl acetate, methoxy butyl acetate, ethoxy methyl acetate, ethoxy ethyl acetate, and the like; 3-oxy propionic acid alkyl esters such as 3-oxy methyl propionate, 3-oxy ethyl propionate, and the like; 3-alkoxy propionic acid alkyl esters such as 3-methoxy methyl propionate, 3-methoxy ethyl propionate, 3-ethoxy ethyl propionate, 3-ethoxy methyl propionate, and the like; 2-oxy propionic acid alkyl esters such as 2-oxy methyl propionate, 2-oxy ethyl propionate, 2-oxy propyl propionate, and the like; 2-alkoxy propionic acid alkyl esters such as 2-methoxy methyl propionate, 2-methoxy ethyl propionate, 2-ethoxy ethyl propionate, 2-ethoxy methyl propionate, and the like; 2-oxy-2-methyl propionic acid esters such 2-oxy-2-methyl methyl propionate, 2-oxy-2-methyl ethyl propionate, and the like, monooxy monocarboxylic acid alkyl esters of 2-alkoxy-2-methyl alkyl propionates such as 2-methoxy-2-methyl methyl propionate, 2-ethoxy-2-methyl ethyl propionate, and the like; esters such as 2-hydroxy ethyl propionate, 2-hydroxy-2-methyl ethyl propionate, hydroxy ethyl acetate, 2-hydroxy-3-methyl methyl butanoate, and the like; ketonate esters such as ethyl pyruvate, and the like. In an implementation, a high boiling point solvent such as N-methylformamide, N,N-dimethylformamide, N-methylformanilide, N-methylacetamide, N,N-dimethylacetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like may be also used.

In an implementation, considering compatibility and reactivity, ketones such as cyclohexanone; glycol ethers such as ethylene glycol monoethyl ether; ethylene glycol alkyl ether acetates such as ethyl cellosolve acetate; esters such as 2-hydroxy ethyl propionate; carbitols such as diethylene glycol monomethyl ether; propylene glycol alkyl ether acetates such as propylene glycol monomethyl ether acetate and propylene glycol propyl ether acetate, and ketones such as cyclohexanone may be used.

In an implementation, the solvent may be included in a balance amount, e.g., about 30 wt % to about 60 wt %, or about 40 wt % to about 50 wt %, based on a total weight of the photosensitive resin composition. When the solvent is included within the above ranges, it is possible to obtain a coating film having excellent coatability of the photosensitive resin composition and excellent flatness.

Other Additives

In an implementation, the photosensitive resin composition may further include an additive, e.g., malonic acid; 3-amino-1,2-propanediol; a coupling agent including a vinyl group or a (meth)acryloxy group; a leveling agent; a surfactant; or a radical polymerization initiator, in order to help prevent stains or spots during the coating, to help adjust leveling, or to help prevent pattern residue due to non-development.

The additives may be adjusted according to desired physical properties.

The coupling agent may include, e.g., a silane coupling agent, and examples of the silane coupling agent may include trimethoxysilyl benzoic acid, γ methacryl oxypropyl trimethoxysilane, vinyl triacetoxysilane, vinyl trimethoxysilane, γ isocyanate propyl triethoxysilane, γ glycidoxy propyl trimethoxysilane, and β epoxycyclohexyl)ethyltrimethoxysilane, which may be used alone or in mixture of 2 or more types.

The silane coupling agent may be included in an amount of about 0.01 part by weight to about 1 part by weight, based on 100 parts by weight of the photosensitive resin composition.

In an implementation, the photosensitive resin composition for color filters may further include a surfactant, e.g., a fluorine surfactant.

Examples of the fluorine surfactant may include F-556, F-482, F-484, and F-478 of DIC Co., Ltd.

In an implementation, the surfactant may be included in an amount of, e.g., about 0.01 wt % to about 5 wt % or about 0.01 wt % to about 2 wt %, based on a total weight of the photosensitive resin composition. If it were to be out of the above range, it could result in the generation of foreign substances after development.

In an implementation, other additives, e.g., an antioxidant, a stabilizer, or the like, may be added to the photosensitive resin composition within a range that does not impair physical properties.

The photosensitive resin composition may be applied to a photosensitive resin composition for a color filter of a CMOS image sensor, e.g., a photosensitive resin composition for a green color filter of a CMOS image sensor.

Photosensitive Resin Layer, Color Filter, and CMOS Image Sensor

According to the embodiments, a photosensitive resin layer manufactured using the photosensitive resin composition may be provided.

In another embodiment, a color filter manufactured using the photosensitive resin composition may be provided.

In another embodiment, a CMOS image sensor including the color filter may be provided.

A method of manufacturing the color filter is as follows.

The aforementioned photosensitive resin composition may be coated to form a photosensitive resin composition layer with an appropriate thickness on a glass substrate in an appropriate method such as spin coating, roller coating, spray coating, or the like.

Subsequently, the substrate having the photosensitive resin composition layer may be irradiated by light to form a pattern required for a color filter. The radiation may be performed by using UV, an electron beam, or an X-ray as a light source, and the UV may be irradiated, e.g., in a region of about 190 nm to about 450 nm or about 200 nm to about 400 nm. The irradiation may be performed by further using a photoresist mask. After performing the irradiation process in this way, the photosensitive resin composition layer exposed to the light source may be treated with a developing solution. A non-exposed region in the photosensitive resin composition layer may be dissolved and forms the pattern for a color filter. This process may be repeated as many times as the number of necessary colors, obtaining a color filter having a desired pattern. In an implementation, when the image pattern obtained through development in the above process is cured by reheating or radiating an actinic ray thereinto, crack resistance, solvent resistance, and the like may be improved.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Preparation of Pigment Mixtures

Preparation Examples 1 to 12

Each pigment mixture was prepared by mixing C.I. Blue Pigment 15:6 (B 15:6) represented by Chemical Formula 1-1 and C.I. Violet Pigment 23 (V 23) represented by Chemical Formula 1-2 in various D50 particle diameter ratios between (B 15:6):(V 23) as shown in Table 1.

[Chemical Formula 1-1]

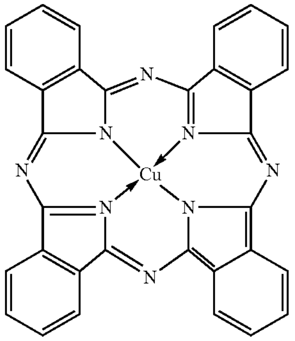

[Chemical Formula 2-1]

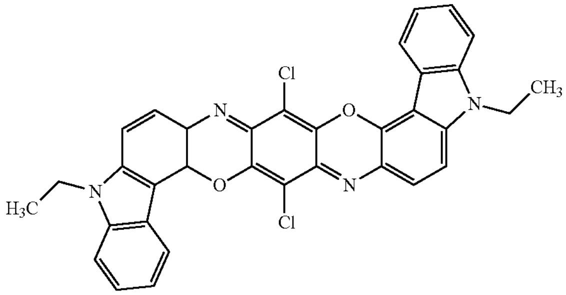

Herein, the D50 particle diameter was obtained by measuring a diffraction pattern difference according to a particle size, when passed through a laser beam, with a laser diffraction particle size measuring device (Microtrac S3500).

TABLE 1

| | D50 particle diameter ratio in pigment mixture (B 15:6):(V 23) |
|---|---|
| Preparation Example 1 | 1:1.5 |
| Preparation Example 2 | 1:1 |
| Preparation Example 3 | 1.01:1 |
| Preparation Example 4 | 1.05:1 |
| Preparation Example 5 | 1.1:1 |
| Preparation Example 6 | 1.2:1 |
| Preparation Example 7 | 1.25:1 |
| Preparation Example 8 | 1.3:1 |
| Preparation Example 9 | 1.4:1 |
| Preparation Example 10 | 1.5:1 |
| Preparation Example 11 | 1.6:1 |
| Preparation Example 12 | 2:1 |

Preparation of Photosensitive Resin Compositions

Examples 1 to 8 and Comparative Examples 1 to 4

Photosensitive resin compositions were prepared according to compositions shown in Tables 2 and 3.

For example, a photopolymerization initiator was dissolved in a solvent and then, stirred at ambient temperature for 30 minutes, and a photopolymerizable compound was added thereto and then, stirred at ambient temperature for 60 minutes. Subsequently, a colorant (pigment) and a binder resin were added to the obtained reactant and then, stirred at ambient temperature for 30 minutes. In addition, an additive was added thereto and then, stirred at ambient temperature for 30 minutes. Then, a product obtained therefrom was filtered twice to remove impurities, preparing a photosensitive resin composition.

TABLE 2

(unit: wt %)

| Component | Material | Comp. Ex. 1 | Comp. Ex. 2 | Ex. 1 | Ex. 2 | Ex. 3 | Ex. 4 |
|---|---|---|---|---|---|---|---|
| (A) Colorant | A-1 | 50 | — | — | — | — | — |
| | A-2 | — | 50 | — | — | — | — |
| | A-3 | — | — | 50 | — | — | — |
| | A-4 | — | — | — | 50 | — | — |
| | A-5 | — | — | — | — | 50 | — |
| | A-6 | — | — | — | — | — | 50 |
| (B) Photopolymerizable compound | B-1 | 2 | 2 | 2 | 2 | 2 | 2 |
| (C) Photopolymerization initiator | C-1 | 0.7 | 0.7 | 0.7 | 0.7 | 0.7 | 0.7 |
| (D) Binder resin | D-1 | 4 | 4 | 4 | 4 | 4 | 4 |
| (E) Solvent | E-1 | 43 | 43 | 43 | 43 | 43 | 43 |
| (F) Additive | F-1 | 0.3 | 0.3 | 0.3 | 0.3 | 0.3 | 0.3 |
| Total amount | | 100 | 100 | 100 | 100 | 100 | 100 |

TABLE 3

(unit: wt %)

| Component | Material | Ex. 5 | Ex. 6 | Ex. 7 | Ex. 8 | Comp. Ex. 3 | Comp. Ex. 4 |
|---|---|---|---|---|---|---|---|
| (A) Colorant | A-7 | 50 | — | — | — | — | — |
| | A-8 | — | 50 | — | — | — | — |
| | A-9 | — | — | 50 | — | — | — |
| | A-10 | — | — | — | 50 | — | — |
| | A-11 | — | — | — | — | 50 | — |
| | A-12 | — | — | — | — | — | 50 |
| (B) Photopolymerizable compound | B-1 | 2 | 2 | 2 | 2 | 2 | 2 |
| (C) Photopolymerization initiator | C-1 | 0.7 | 0.7 | 0.7 | 0.7 | 0.7 | 0.7 |
| (D) Binder resin | D-1 | 4 | 4 | 4 | 4 | 4 | 4 |
| (E) Solvent | E-1 | 43 | 43 | 43 | 43 | 43 | 43 |
| (F) Additive | F-1 | 0.3 | 0.3 | 0.3 | 0.3 | 0.3 | 0.3 |
| Total amount | | 100 | 100 | 100 | 100 | 100 | 100 |

Each component used in Tables 2 and 3 was as follows.

(A) Colorant (A-1) Pigment mixture of Preparation Example 1 ((B 15:6):(V 23) D50 particle diameter ratio=1:1.5)

(A-2) Pigment mixture of Preparation Example 2 ((B 15:6):(V 23) D50 particle diameter ratio=1:1)

(A-3) Pigment mixture of Preparation Example 3 ((B 15:6):(V 23) D50 particle diameter ratio=1.01:1)

(A-4) Pigment mixture of Preparation Example 4 ((B 15:6):(V 23) D50 particle diameter ratio=1.05:1)

(A-5) Pigment mixture of Preparation Example 5 ((B 15:6):(V 23) D50 particle diameter ratio=1.1:1)

(A-6) Pigment mixture of Preparation Example 6 ((B 15:6):(V 23) D50 particle diameter ratio=1.2:1)

(A-7) Pigment mixture of Preparation Example 7 ((B 15:6):(V 23) D50 particle diameter ratio=1.25:1)

(A-8) Pigment mixture of Preparation Example 8 ((B 15:6):(V 23) D50 particle diameter ratio=1.3:1)

(A-9) Pigment mixture of Preparation Example 9 ((B 15:6):(V 23) D50 particle diameter ratio=1.4:1)

(A-10) Pigment mixture of Preparation Example 10 ((B 15:6):(V 23) D50 particle diameter ratio=1.5:1)

(A-11) Pigment mixture of Preparation Example 11 ((B 15:6):(V 23) D50 particle diameter ratio=1.6:1)

(A-12) Pigment mixture of Preparation Example 12 ((B 15:6):(V 23) D50 particle diameter ratio=2:1)

(B) Photopolymerizable Compound (C-1) Dipentaerythritolhexaacrylate (DPHA, manufacturer: Nippon Kayaku Co., Ltd.)

(D) Photopolymerization initiator (D-1) Oxime initiator (SPI-03, manufacturer: Samyang Corporation)

(B) Binder Resin (B-1) Acrylic binder resin (RY-92, manufacturer: Showa Denko, molecular weight: 6,000 g/mol, acid value: 35 KOHmg/g, double bond equivalent: 350 g/mol)

(E) Solvent (E-1) Propylene glycol monomethyl ether acetate (PGMEA, manufacturer: Sigma-Aldrich)

(F) Additive (F-1) Fluorine surfactant (F-554, manufacturer: DIC Co., Ltd.)

(Evaluation 1: Dispersion Stability of Photosensitive Resin Compositions)

Each photosensitive resin composition of Examples 1 to 8 and Comparative Examples 1 to 4 was evaluated with respect to dispersion stability according to Equation 1. For example, because a color value changes, as the dispersion stability deteriorates, a transmittance difference before and after allowed to stand at ambient temperature for one month was calculated by using a spectrophotometer.

$$\text{Composition dispersion stability}=(a)-(b) \quad \text{[Equation 1]}$$

In Equation 1, (a) is transmittance (% T) obtained immediately after preparing a photosensitive resin composition by a spectrophotometer; and (b) is transmittance (% T) obtained after the photosensitive resin composition is allowed to stand at ambient temperature after 1 month by using the spectrophotometer.

The evaluation results are shown in Table 4.

TABLE 4

| | (B 15:6):(V 23) D50 particle diameter ratio in pigment mixture | Composition dispersion stability |
|---|---|---|
| Comp. Ex. 1 | 1:1.5 | 5.1 |
| Comp. Ex. 2 | 1:1 | 1.1 |
| Ex. 1 | 1.01:1 | 0.9 |
| Ex. 2 | 1.05:1 | 0.8 |
| Ex. 3 | 1.1:1 | 1.2 |
| Ex. 4 | 1.2:1 | 1.3 |
| Ex. 5 | 1.25:1 | 1.4 |
| Ex. 6 | 1.3:1 | 1.0 |
| Ex. 7 | 1.4:1 | 1.2 |
| Ex. 8 | 1.5:1 | 1.4 |
| Comp. Ex. 3 | 1.6:1 | 3.2 |
| Comp. Ex. 4 | 2:1 | 1.9 |

(Evaluation 2: Evaluation of Optical Properties of Color Filters)

Each photosensitive resin composition of Examples 1 to 8 and Comparative Examples 1 to 4 was coated on an 8-inch glass substrate with a spin coater (Opticoat MS-A150, Mikasa Co., Ltd.), soft-baked on a hot plate, and exposed to light for 1,000 msec with an i-line stepper (NSR-2005i10C, Nikon Corp.)

The exposed substrate was developed in a 0.19% TMAH aqueous solution at ambient temperature in a spray & puddle method and then, hard-baked on the hot plate at 200° C. for 5 minutes. Accordingly, a 5,800 Å-thick photosensitive resin film was formed on the glass substrate, obtaining a color filter specimen.

Five images of each obtained color filter specimen was taken by a microscope (Model name: MSS1F, Manufacturer: Olympus Corp.) at 500 magnifications.

After shading the images, an area ratio per pixel was extracted and calculated to compare ±1% areas from the center. When the ±1% areas were large, as an area per pixel on the color filter surface is larger, it was closer to the center. In other words, as the ±1% areas from the center in terms of an area per pixel on the color filter surface was higher, a degree of optical disturbance such as color non-uniformity and the like on the color filter surface became similar, which means a less step difference on the images.

TABLE 5

| | (B 15:6):(V 23) D50 particle diameter ratio in pigment mixture | Area per pixel of color filter surface (%) |
|---|---|---|
| Comp. Ex. 1 | 1:1.5 | 50218 |
| Comp. Ex. 2 | 1:1 | 60103 |
| Ex. 1 | 1.01:1 | 68103 |
| Ex. 2 | 1.05:1 | 69112 |
| Ex. 3 | 1.1:1 | 72759 |
| Ex. 4 | 1.2:1 | 74125 |
| Ex. 5 | 1.25:1 | 73789 |
| Ex. 6 | 1.3:1 | 72097 |
| Ex. 7 | 1.4:1 | 70625 |
| Ex. 8 | 1.5:1 | 70023 |
| Comp. Ex. 3 | 1.6:1 | 62240 |
| Comp. Ex. 4 | 2:1 | 61297 |

Referring to Tables 4 and 5, when a pigment mixture satisfied a D50 particle diameter ratio of (B 15:6):(V 23) of about 1.01:1 to about 1.5:1, as dispersibility of the pigment mixture in the photosensitive resin composition was stabilized, an area per pixel on the final color filter surface became significantly large. When a pigment mixture satisfied a D50 particle diameter ratio of (B 15:6):(V 23) of about 1.1:1 to about 1.3:1, the aforementioned effect became much clearer.

Herein, although the mixture of B 15:6 and V 23 was used as an example as a pigment mixture, the above effect may be obtained with any suitable dye combination satisfying a D50 particle diameter ratio of about 1.01:1 to about 1.5:1.

By way of summation and review, a color filter may have a coloring pattern of three primary colors such as red (R), green (G), and blue (B) and thus may play a role of decomposing transmitted light into the three primary colors. The color filter may use a colorant, which should have no optical disturbance such as non-uniformity of optical density but have desirable light absorption characteristics in terms of color reproducibility and satisfactory heat resistance and light resistance under conditions of its manufacturing and using environment and may be thinned due to its large molar extinction coefficient.

A method of manufacturing the color filter may include a pigment dispersion method. A photolithography or inkjet method using a pigment to manufacture the color filter may be stable against light or heat because of the pigment. However, the pigment may be in the form of particulates, and the color filter manufactured by using the pigment may have the optical disturbance. The pigment could be miniaturized, but a fine pigment could have issues in securing dispersion stability.

One or more embodiments may provide a composition that addresses an optical disturbance that could otherwise caused by the photosensitive resin composition.

In the embodiments, in the photosensitive resin composition in which at least two types of pigments are co-dispersed, by adjusting a particle size ratio of the co-dispersed pigments, light scattering of the color filter, color non-uniformity, or the like may be suppressed and optical disturbance may be eliminated.

Accordingly, the color filter manufactured using the photosensitive resin composition of the embodiments may contribute to realizing image quality of the image sensor at a constant level.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A photosensitive resin composition, comprising:

a colorant;

a photopolymerizable compound;

a photopolymerization initiator;

a binder resin; and a solvent, wherein:

the colorant includes a first pigment and a second pigment, and a D50 particle diameter ratio of the first pigment and the second pigment is about 1.01:1 to about 1.5:1.

2. The photosensitive resin composition as claimed in claim 1, wherein the D50 particle diameter ratio of the first pigment and the second pigment is about 1.1:1 to about 1.3:1.

3. The photosensitive resin composition as claimed in claim 1, wherein the first pigment is a blue pigment and the second pigment is a violet pigment.

4. The photosensitive resin composition as claimed in claim 3, wherein:

the first pigment includes a copper phthalocyanine blue pigment represented by Chemical Formula 1:

[Chemical Formula 1]

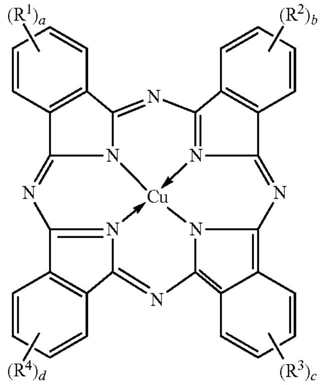

in Chemical Formula 1, $R^1$ to $R^4$ are each independently a hydrogen atom, a halogen atom, a cyano group, a hydroxy group, an epoxy group, a (meth)acrylate group, or a substituted or unsubstituted C1 to C20 alkyl group; and a to d are each independently an integer of 1 to 4.

5. The photosensitive resin composition as claimed in claim 3, wherein the first pigment includes a copper phthalocyanine blue pigment represented by Chemical Formula 1-1:

[Chemical Formula 1-1]

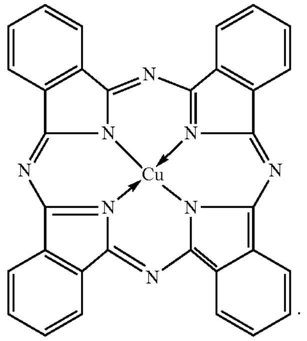

6. The photosensitive resin composition as claimed in claim 3, wherein:

the second pigment includes a carbazole dioxazine violet pigment represented by Chemical Formula 2, a perylene violet pigment represented by Chemical Formula 3, or a mixture thereof,

[Chemical Formula 2]

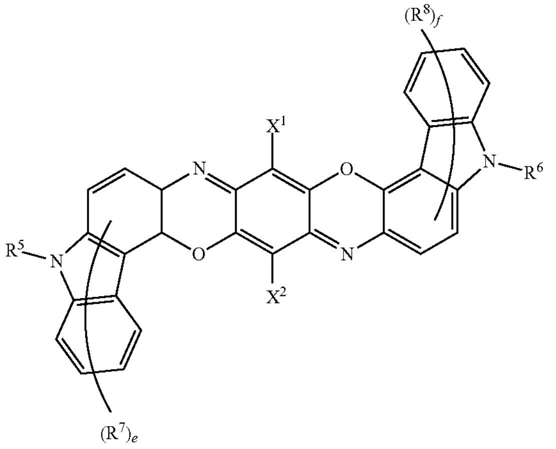

in Chemical Formula 2, $R^5$ and $R^6$ are each independently a hydrogen atom or a substituted or unsubstituted C1 to C20 alkyl group;

$R^7$ and $R^8$ are each independently a hydrogen atom, a halogen atom, a cyano group, a hydroxy group, an epoxy group, a (meth)acrylate group, or a substituted or unsubstituted C1 to C20 alkyl group;

$X^1$ and $X^2$ are each independently a halogen atom; and e and f are each independently an integer of 1 to 6;

[Chemical Formula 3]

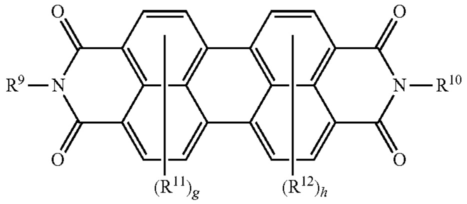

in Chemical Formula 3, $R^9$ and $R^{10}$ are each independently a hydrogen atom or a substituted or unsubstituted C1 to C20 alkyl group;

$R^{11}$ and $R^{12}$ are each independently a hydrogen atom, a halogen atom, a cyano group, a hydroxy group, an epoxy group, a (meth)acrylate group, or a substituted or unsubstituted C1 to C20 alkyl group; and g and h are each independently an integer of 1 to 4.

7. The photosensitive resin composition as claimed in claim 6, wherein the second pigment includes a carbazole dioxazine violet pigment represented by Chemical Formula 2-1, a perylene violet pigment represented by Chemical Formula 3-1, or a mixture thereof,

[Chemical Formula 2-1]

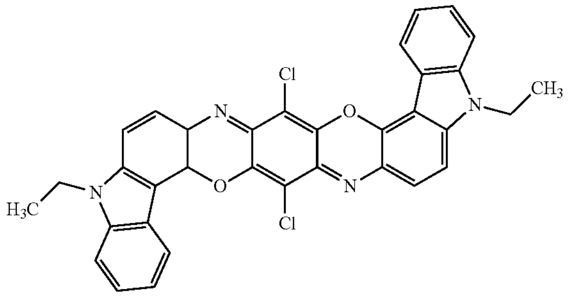

[Chemical Formula 3-1]

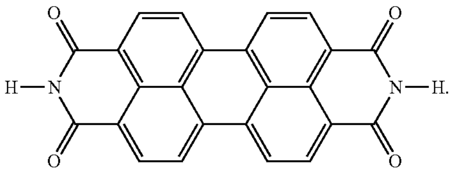

8. The photosensitive resin composition as claimed in claim 1, wherein a weight ratio of the first pigment and the second pigment is about 10:90 to about 90:10.

9. The photosensitive resin composition as claimed in claim 1, wherein all pigments of the photosensitive resin composition are included in an amount of about 30 wt % to about 40 wt %, based on a total weight of the photosensitive resin composition.

10. The photosensitive resin composition as claimed in claim 1, wherein the binder resin includes an acrylic binder resin, an epoxy binder resin, or a combination thereof.

11. The photosensitive resin composition as claimed in claim 1, wherein the photosensitive resin composition includes:

about 30 wt % to about 70 wt % of the colorant;

about 1 wt % to about 20 wt % of the photopolymerizable compound;

about 0.1 wt % to about 5 wt % of the photopolymerization initiator;

about 1 wt % to about 20 wt % of the binder resin; and the solvent, all wt % being based on a total weight of the photosensitive resin composition.

12. The photosensitive resin composition as claimed in claim 1, wherein the photosensitive resin composition further includes malonic acid; 3-amino-1,2-propanediol; a coupling agent including a vinyl group or a (meth)acryloxy group; a leveling agent; a fluorine surfactant; or a radical polymerization initiator.

13. The photosensitive resin composition as claimed in claim 1, wherein in the first pigment and the second pigment, the D90/D10 particle diameter ratio may be about 1.5 to about 2.0.

14. A photosensitive resin layer manufactured using the photosensitive resin composition as claimed in claim 1.

15. A color filter comprising the photosensitive resin layer as claimed in claim 14.

16. A CMOS image sensor comprising the color filter as claimed in claim 15.

* * * * *